US012581625B2

(12) United States Patent
Tokuyama et al.

(10) Patent No.:　US 12,581,625 B2
(45) Date of Patent:　Mar. 17, 2026

(54) POWER CONVERSION DEVICE

(71) Applicant: HITACHI ASTEMO, LTD.,
Hitachinaka (JP)

(72) Inventors: Takeshi Tokuyama, Tokyo (JP);
Takahiro Araki, Tokyo (JP); **Shigehisa
Aoyagi, Hitachinaka (JP); Noriyuki
Maekawa**, Hitachinaka (JP)

(73) Assignee: HITACHI ASTEMO, LTD.,
Hitachinaka (JP)

( * ) Notice: Subject to any disclaimer, the term of this
patent is extended or adjusted under 35
U.S.C. 154(b) by 200 days.

(21) Appl. No.: 18/564,139

(22) PCT Filed: Feb. 25, 2022

(86) PCT No.: PCT/JP2022/008092

§ 371 (c)(1),
(2) Date: Nov. 27, 2023

(87) PCT Pub. No.: WO2023/276267

PCT Pub. Date: Jan. 5, 2023

(65) Prior Publication Data

US 2024/0251532 A1　　Jul. 25, 2024

(30) Foreign Application Priority Data

Jul. 1, 2021　(JP) ................................. 2021-110275

(51) Int. Cl.
H05K 7/20　　　(2006.01)
H02M 7/00　　　(2006.01)
(Continued)

(52) U.S. Cl.
CPC ........ H05K 7/20927 (2013.01); H02M 7/003
(2013.01); H05K 1/181 (2013.01); **H05K
2201/0323** (2013.01)

(58) Field of Classification Search
CPC ............... H01L 23/49531; H01L 24/33; H01L
2224/49431; H01L 2924/1203;
(Continued)

(56) References Cited

U.S. PATENT DOCUMENTS 4,872,102 A　*　10/1989　Getter ................... H02M 7/003
361/709
9,148,946 B1 *　9/2015　Singh ................... H05K 7/2089
(Continued)

FOREIGN PATENT DOCUMENTS

JP　　　2004-072959 A　　3/2004
JP　　　2009-004666 A　　1/2009
(Continued)

OTHER PUBLICATIONS

Japanese Office Action issued in corresponding JP Application No.
2021-110275, dated Nov. 26, 2024 with English translation (16
pages).
(Continued)

*Primary Examiner* — Michael A Matey
(74) *Attorney, Agent, or Firm* — Foley & Lardner LLP

(57) ABSTRACT

A power conversion device includes a plurality of circuit
bodies each including a semiconductor element, and a
printed circuit board having the plurality of circuit bodies
mounted thereon and having a relay wiring connecting the
plurality of circuit bodies to each other, a DC wiring, and an
AC wiring, wherein at least one of the AC wiring and the DC
wiring is connected to a conductor member.

5 Claims, 13 Drawing Sheets

(51) Int. Cl.
*H05K 1/18* (2006.01)
*H05K 1/181* (2026.01)

(58) Field of Classification Search
CPC ........ H02M 7/003; H02M 1/08; H02M 3/003;
H02M 7/217; H02P 27/06; H05K 1/0209;
H05K 7/20254; H05K 7/205; H05K
7/2089; H05K 7/20927; H05K 1/181;
H05K 2201/0323; H02J 7/00
See application file for complete search history.

(56) References Cited

U.S. PATENT DOCUMENTS

| | | | |
|---|---|---|---|
| 2003/0067749 A1* | 4/2003 | Tamba ............... | H05K 7/20927 |
| | | | 165/80.4 |
| 2008/0225482 A1* | 9/2008 | Smith ................. | H01L 23/4735 |
| | | | 361/699 |
| 2008/0315401 A1 | 12/2008 | Imamura et al. | |
| 2009/0154101 A1* | 6/2009 | Korich ................. | H02M 7/003 |
| | | | 361/689 |
| 2010/0327654 A1* | 12/2010 | Azuma ................. | H01L 25/072 |
| | | | 307/9.1 |
| 2011/0299208 A1 | 12/2011 | Suzuki et al. | |
| 2013/0056755 A1 | 3/2013 | Hatai et al. | |
| 2013/0286617 A1* | 10/2013 | Shibasaki ............. | H01L 23/482 |
| | | | 361/772 |
| 2013/0286618 A1* | 10/2013 | Shibasaki ......... | H01L 23/49811 |
| | | | 361/772 |
| 2019/0245433 A1* | 8/2019 | Yan ....................... | H05K 7/1427 |
| 2019/0335577 A1* | 10/2019 | Götz ...................... | H05K 7/209 |
| 2020/0388558 A1 | 12/2020 | Tani | |
| 2022/0093321 A1* | 3/2022 | Nishizaka ........... | H01F 27/2876 |

FOREIGN PATENT DOCUMENTS

| | | |
|---|---|---|
| JP | 2010-193714 A | 9/2010 |
| JP | 2011-142162 A | 7/2011 |
| JP | 2016-220339 A | 12/2016 |
| JP | 2018-137343 A | 8/2018 |
| JP | 2020-061831 A | 4/2020 |
| JP | 2021-057407 A | 4/2021 |
| WO | WO-2010/119514 A1 | 10/2010 |
| WO | WO-2011/145219 A1 | 11/2011 |
| WO | WO-2018/220721 A1 | 12/2018 |

OTHER PUBLICATIONS

International Search Report with English Translation and Written Opinion in corresponding International Application No. PCT/JP2022/008092, dated May 10, 2022 (9 pages).

* cited by examiner

POWER CONVERSION DEVICE

TECHNICAL FIELD

The present invention relates to power conversion devices.

BACKGROUND ART

As a background art regarding the invention of the present application, PTL 1 cited below describes a technique for bonding an auxiliary board to a printed circuit board constituting inverter circuit wirings, and further connecting the front and the back of the auxiliary board to each other through a through via, in order to suppress heat generation in a semiconductor device.

CITATION LIST

Patent Literature

PTL 1: JP 2018-137343 A

SUMMARY OF INVENTION

Technical Problem

Based on the structure of Patent Literature 1, it is an object of the present invention to provide a power conversion device capable of achieving both cost reduction and high reliability, in order to further reduce wiring heat generation in a printed circuit board with lower cost for increasing the value of the current usable for driving.

Solution to Problem

A power conversion device according to the present invention includes a plurality of circuit bodies each including a semiconductor element, and a printed circuit board having the plurality of circuit bodies mounted thereon and having a relay wiring connecting the plurality of circuit bodies to each other, a DC wiring, and an AC wiring, wherein at least one of the AC wiring and the DC wiring is connected to a conductor member.

Advantageous Effects of Invention

According to the present invention, it is possible to provide a power conversion device capable of achieving both cost reduction and high reliability.

BRIEF DESCRIPTION OF DRAWINGS

FIG. 7 is a perspective view of the main circuit unit, wherein illustration of a sealing resin is omitted.

FIG. 12 is a modification of FIG. 11.

Figure 1:
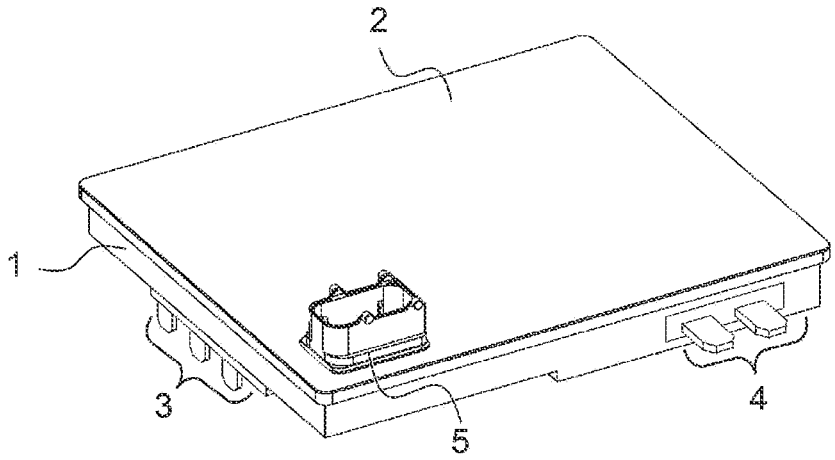
FIG. 1 is an overall perspective view of an inverter.

Hereinafter, an embodiment of the present invention will be described with reference to the drawings. The following description and drawings are merely examples for explaining the present invention, and omission and simplification are made thereto appropriately for the sake of clarification of explanation. The present invention can be also implemented in other various aspects. Unless otherwise specified, as each constituent component, it is possible to provide one or plural such constituent components.

The position, the size, the shape, the range and the like of each constituent component illustrated in the drawings may not express its actual position, size, shape, range and the like, in order to facilitate understanding of the invention, in some cases. Therefore, the present invention is not necessarily limited to the positions, sizes, shapes, ranges and the like disclosed in the drawings.

(The Overall Structure Including One Embodiment of the Present Invention)

FIG. 1 is an overall perspective view of an inverter.

An inverter housing 1 is interiorly sealed by a lid body 2, and the housing 1 interiorly incorporates cooling water paths and inverter constituent components which will be described later. An AC connector 3 and a DC connector 4 are protruded from the inverter housing 1, and a signal connector 5 is outputted from the lid body 2.

Figure 2:
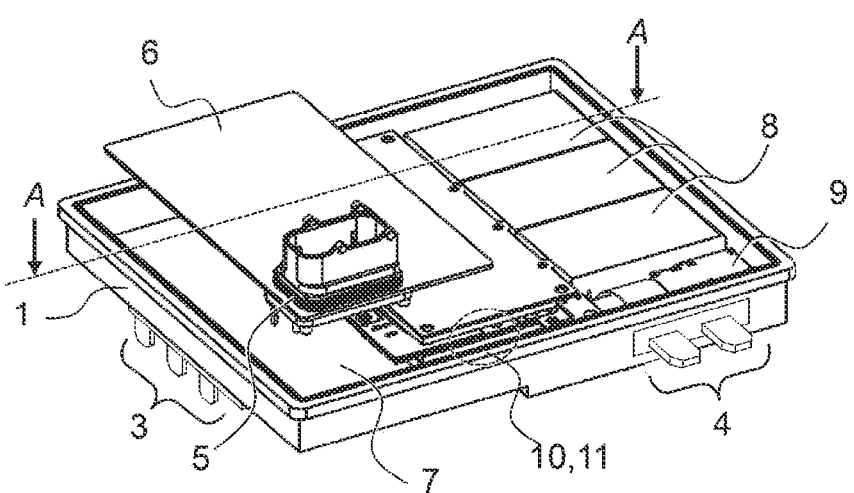
FIG. 2 is an overall perspective view of the inverter after a lid body is opened.
Figure 3:
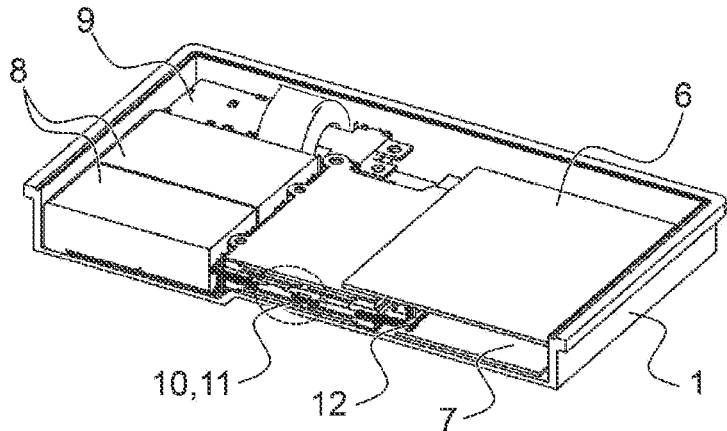
FIG. 3 is a perspective view cut along an A-A cut line in FIG. 2.
Figure 4:
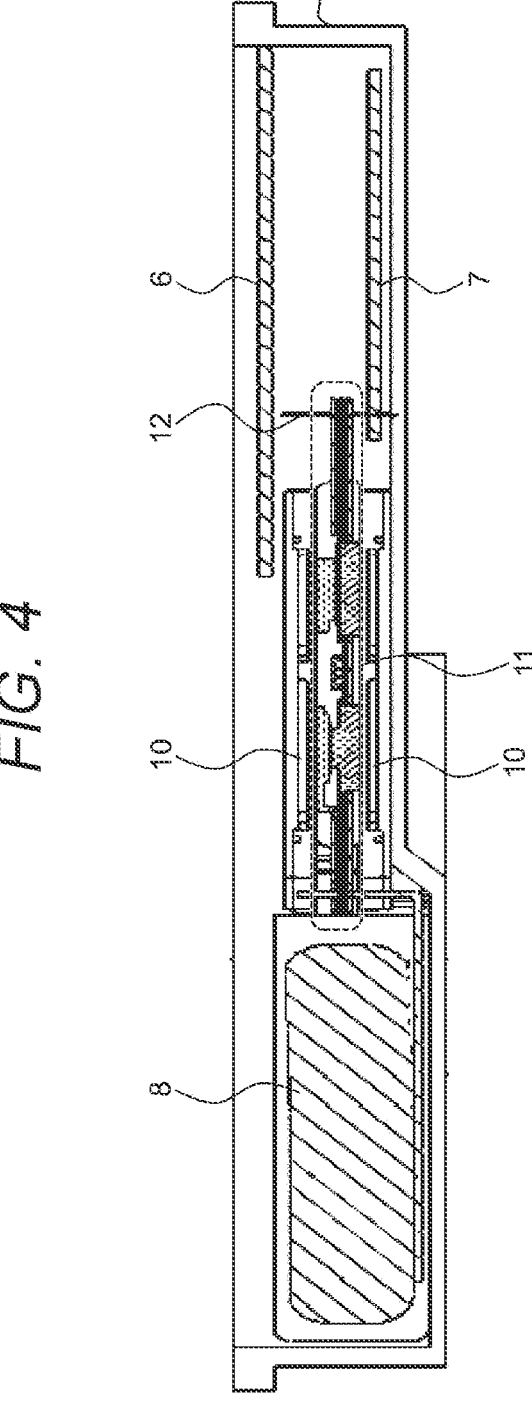
FIG. 4 is a cross-sectional view taken along A-A in FIG. 2.

FIG. 2 is an overall perspective view of the inverter after the lid body is opened. FIG. 3 is a perspective view cut along an A-A cut line in FIG. 2. FIG. 4 is a cross-sectional view taken along A-A in FIG. 2.

In the inverter housing 1, there are disposed a motor control board 6, a gate drive board 7, a smoothing capacitor 8, an EMC filter 9, cooling water paths 10, and a main circuit unit 11. The motor control board 6 is mounted at an upper portion of the housing 1 in such a way as to cover the gate drive board 7, the cooling water paths 10, and the main circuit unit 11. The signal connector 5 is mounted on the motor control board 6, and is penetrated through the lid body 2 to protrude to the outside, as described above.

On the gate drive board 7, board bonding pins 12 are mounted (see FIG. 4). The board bonding pins 12 are electrically connected to board bonding through holes 22 (see FIG. 6) included in the main circuit unit 11, through a bonding material such as a solder. The main circuit unit 11 is sandwiched between the cooling water paths 10 in the upward and downward directions in the paper surface and is fixed thereto.

Figure 5:
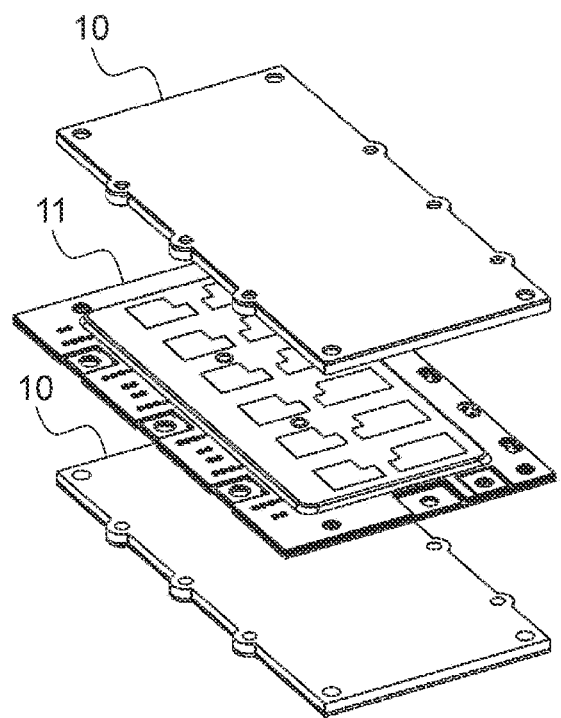
FIG. 5 is a developed view of a main circuit unit and cooling water paths.
Figure 6:
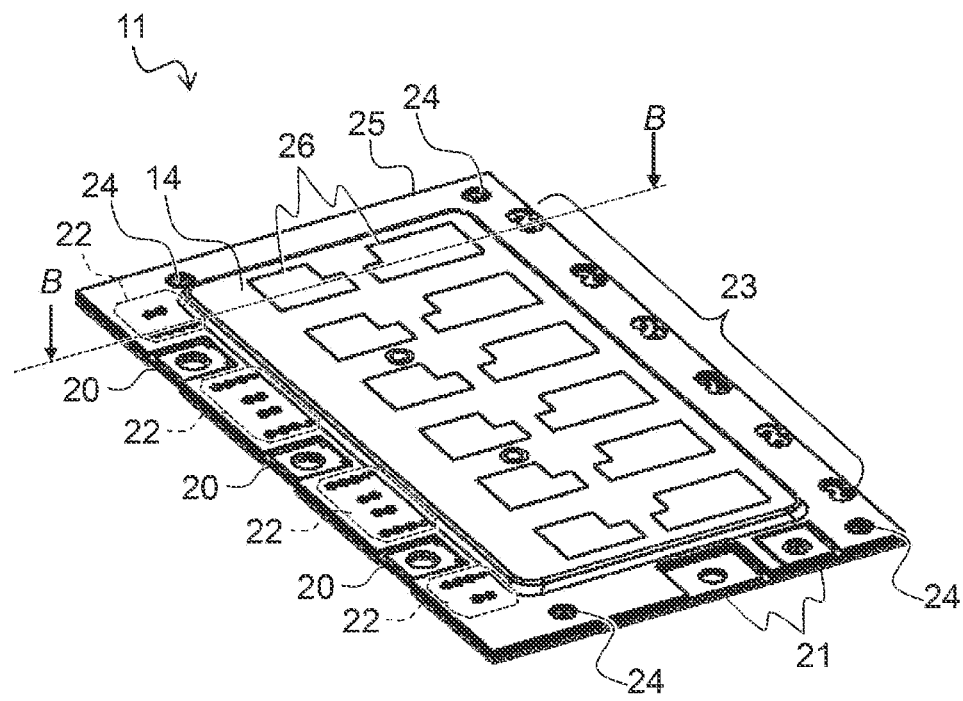
FIG. 6 is a perspective view of the main circuit unit.
Figure 7:
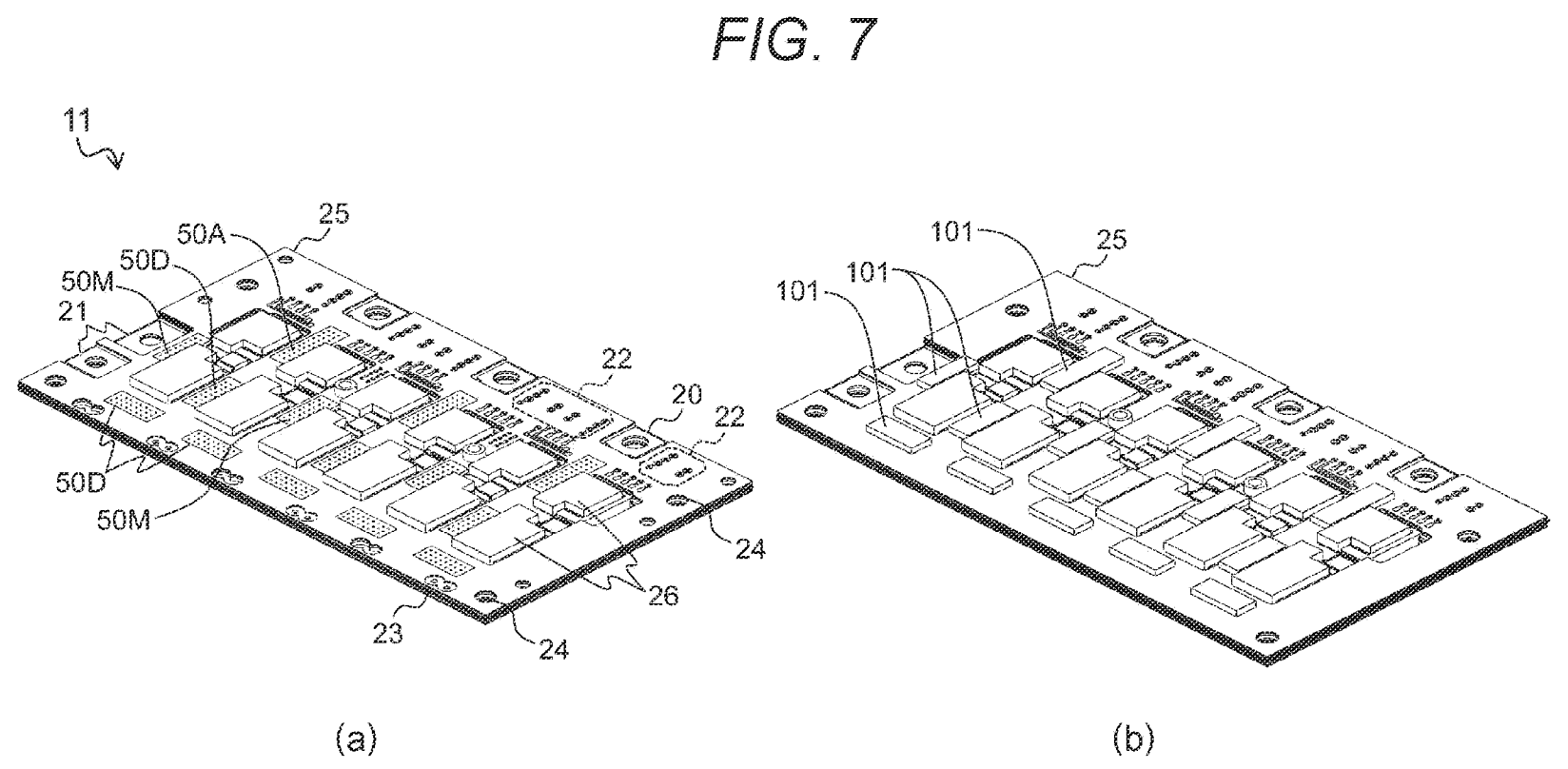

FIG. 5 is a developed view of the main circuit unit and the cooling water paths. FIG. 6 is a perspective view of the main circuit unit. FIG. 7 is a perspective view of the main circuit unit, wherein illustration of a sealing resin is omitted.

Fixing holes 24 are portions for fixing the main circuit unit 11 sandwiched at its both surfaces between the cooling water paths 10, through screwing or other method. The cooling water paths 10 cool power semiconductor elements mounted in a plurality of lead packages 26 in the main circuit unit 11 and main circuit wirings in respective portions.

The main circuit unit 11 includes the plurality of lead packages 26 mounted on a printed circuit board 25, and a sealing resin 14 which seals the entirety of them. On the printed circuit board 25, there are formed AC connection portions 20 and DC connection portions 21, and AC bus bars and DC bus bars are electrically coupled to these respective connection portions through screws fastened therethrough. Further, the gate drive board 7 and the smoothing capacitor 8 described above are electrically connected to board bonding through holes 22 and capacitor bonding through holes 23, respectively, through a bonding material such as a solder.

Incidentally, AC wiring exposed portions 50A, relay wiring exposed portions 50M, DC wiring exposed portions 50D, and conductor members 101 illustrated in FIG. 7 will be described later in detail with reference to FIG. 10.

Figure 8:
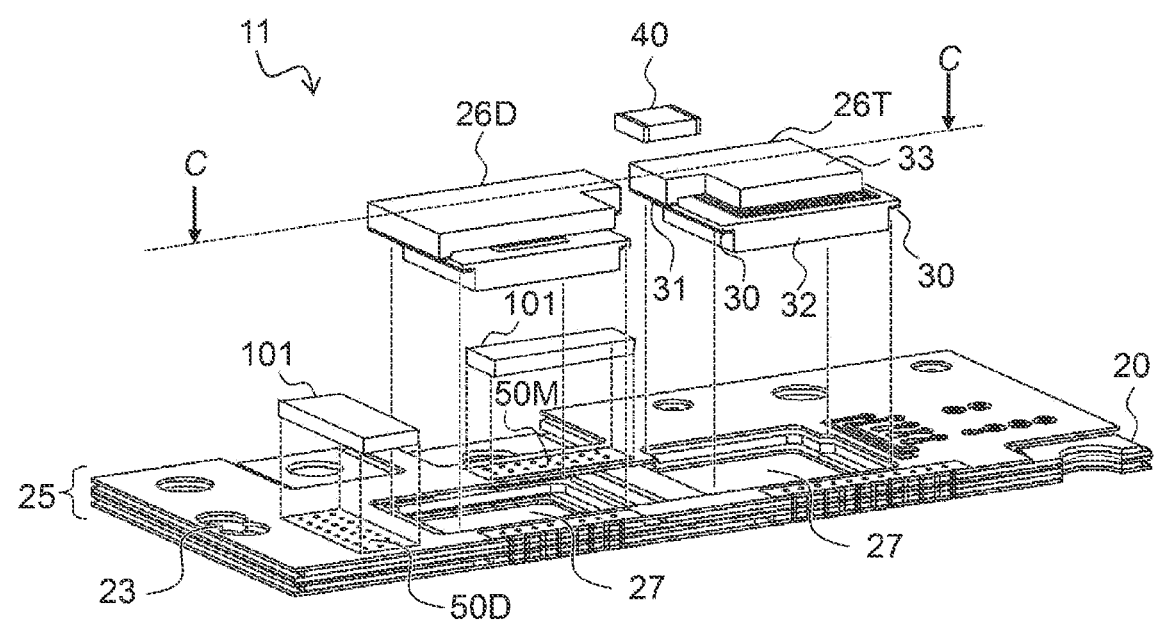
FIG. 8 is a cut perspective view of the main circuit unit according to an embodiment of the present invention, wherein illustration of the sealing resin is omitted.
Figure 9:
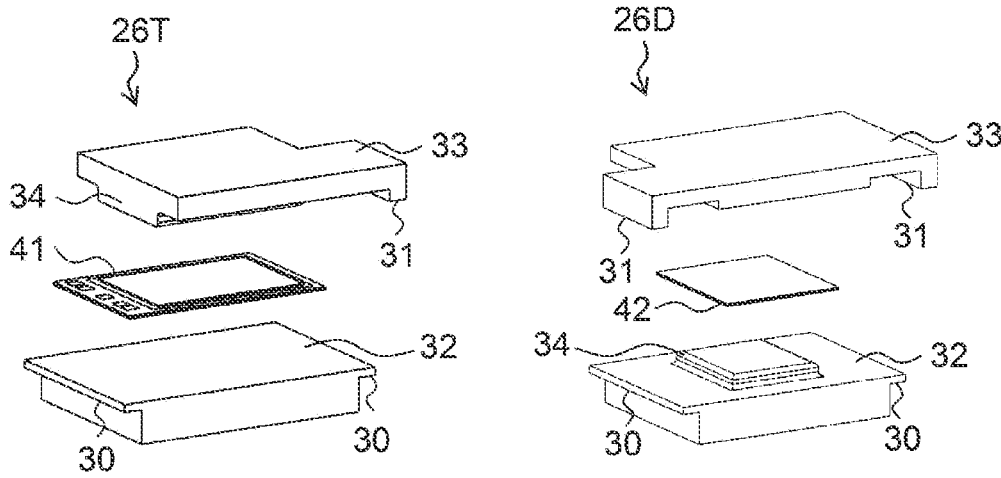
FIG. 9 is a developed perspective view of lead packages.

FIG. 8 is a cut perspective view of the main circuit unit according to an embodiment of the present invention, wherein illustration of the sealing resin is omitted. FIG. 9 is a developed perspective view of the lead packages.

The lead packages 26 include an IGBT lead package 26T and a diode lead package 26D, which are circuit bodies. The lead packages 26 are inserted in through holes 27 formed in the printed circuit board 25. The IGBT lead package 26T and the diode lead package 26D include respective connection portions 30 and 31, which are electrically connected through soldering or the like to respective connection portions in the printed circuit board 25 which will be described later. This provides a configuration in which, when the circuit bodies are connected to each other, the wirings between the circuit bodies and the main circuit unit 11 and the wirings between the circuit bodies and the printed circuit board 25 are integrated on the printed circuit board 25.

In the lead packages 26T and 26D, a first lead frame 32 and a second lead frame 33, which are conductor portions, are electrically bonded to each other in such a way as to sandwich, therebetween, electrodes on both surfaces of an IGBT element 41 or a diode element 42. Further, the lead frame 33 in the IGBT lead package 26T and the lead frame 32 in the diode lead package 26D are provided with a pedestal electrode 34 for connecting the lead frame to the surface electrodes of each element 41, 42 while providing an insulation distance therebetween. The pedestal electrodes 34 are connected to the IGBT element 41 and the diode element 42, respectively, when the lead frames are electrically bonded to each other.

The respective first connection portions 30 provided at both end portions of the first lead frames 32 are electrically bonded to protruding portions 27a provided inside the through holes 27, which will be described later. Further, the second connection portions 31 provided in the second lead frames 33 are connected to surface layer wirings on the printed circuit board 25 to form main circuit wirings.

A snubber capacitor 40 is connected to a positive electrode wiring and a negative electrode wiring provided on the printed circuit board 25, and supplies a transient current at the time of switching.

Figure 10:
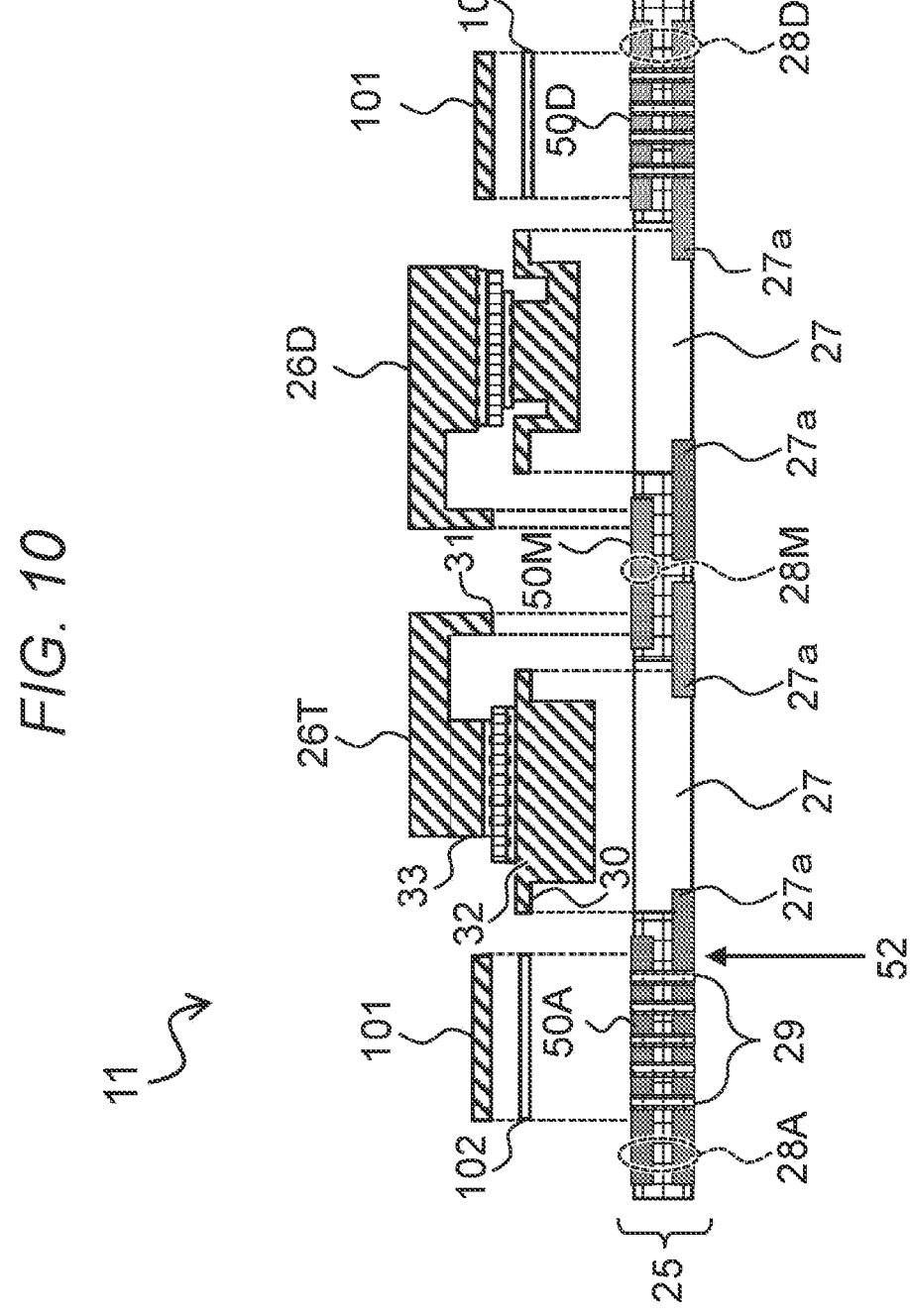
FIG. 10 is a cross-sectional view taken along C-C in FIG. 8, illustrating a connection between the lead packages and printed-circuit-board main circuits according to an embodiment of the present invention.

FIG. 10 is a cross-sectional view taken along C-C in FIG. 8, illustrating the connection between the lead packages and the printed-circuit-board main circuits according to an embodiment of the present invention.

The circuit bodies illustrated in FIG. 10 are constituted by the IGBT element and the diode element, the first lead frames 32, and the second lead frames 33. The printed circuit board 25 is constituted by the through holes 27, an AC wiring 28A, a relay wiring 28M, and a DC wiring 28D.

On the front and the back (the surfaces in the upper and lower side in the paper surface) of the printed circuit board 25, board layers are added to the respective surfaces. On the surface of the printed circuit board 25, the AC wiring 28A, the relay wiring 28M, and the DC wiring 28D are exposed to form the wiring exposed portions 50A, 50M, and 50D, respectively. Further, a back-surface board layer 52 is formed on the surface of the printed circuit board 25 which is opposite to the surface provided with the wiring exposed portions 50A, 50M, and 50D.

The AC wiring 28A is constituted by two wiring members stacked in the thickwise direction of the printed circuit board 25. Incidentally, the AC wiring 28A may be also structured to have a plurality of layers, which are not limited to two layers, such that these layers are stacked in the thickwise direction of the printed circuit board 25. The AC wiring exposed portions 50A are the portions of the AC wiring 28A which are exposed from the printed circuit board 25, and conductor members 101 are bonded thereto through a bonding member 102 such as a solder.

Further, the DC wiring 28D is constituted by a positive-electrode side wiring and a negative-electrode side wiring which are stacked. Conductor members 101 are bonded through a bonding member 102 such as a solder to the DC wiring exposed portions 50D (the portions of the DC wiring 28D which are exposed from the printed circuit board 25) connected to the DC wiring 28D, similarly to the AC wiring exposed portions 50A. Although not illustrated, conductor members 101 may be further bonded to the relay wiring exposed portions 50M through a bonding member 102 such as a solder. This can reduce the wiring resistance of the board wirings, and further can secure the insulation of the back-surface board layer formed on the opposite side from the circuit-bodies mounted surface of the printed circuit board 25.

Further, the AC wiring exposed portions 50A, the relay wiring exposed portions 50M, and the DC wiring exposed portions 50D are electrically connected to the AC wiring 28A, the relay wiring 28M, and the DC wiring 28D, respectively, via through vias 29.

There will be described an effect of mounting and connecting the conductor members 101 to the wiring exposed portions 50A, 50M, and 50D. For example, the AC wiring 28A is a portion which induces concentration of heat generation in the circuit bodies. During driving with a large current exceeding 500 Arms, the AC wiring 28A raises its temperature due to wiring heat generation, and if the temperature of the AC wiring 28A exceeds the heat-resistant temperature of the printed circuit board 25, this may deteriorate the reliability of the device. For coping therewith, by additionally mounting and connecting the conductor members 101 to the portions where the AC wiring 28A (the wiring exposed portions 50A) is disposed on the surface of the printed circuit board 25, it is possible to reduce the wiring resistance to increase the value of the current usable for driving, thereby reducing the wiring heat generation. Further, similarly, by additionally mounting and connecting the conductor members 101 to the DC wiring 28D (the wiring exposed portions 50D) on the surface of the printed circuit board 25, it is possible to further reduce the wiring resistance, which can further increase the value of the current usable for driving, thereby further reducing the wiring heat generation.

Even if the conductor members 101 are mounted and connected to only the AC wiring exposed portions 50A or the DC wiring exposed portions 50D, it is possible to expect the effect of achieving the object of the present invention. Further, by mounting and connecting the conductor members 101 to the relay wiring exposed portions 50M as well as to the AC wiring exposed portions 50A and the DC wiring exposed portions 50D, it is possible to further enhance the effect of the present invention. However, depending on the design, it is also possible to omit the conductor members 101 mounted and connected to the relay wiring exposed portions 50M.

The conductor members 101 contain a carbon-based fiber material having excellent thermal conductivity in the planar direction or an alloy material (metal) such as a copper alloy or an aluminum alloy. This enables achieving reduction in wiring heat generation, due to the improved thermal conductivity of the conductor member 101. Further, the AC wiring 28A and the DC wiring 28D are made to have the laminated-layer configurations and, therefore, have reduced inductances.

The first connection portions 30 of the first lead frames 32 and the protruding portions 27a in the through holes 27 are electrically connected to each other through soldering or the like. Concurrently, the second connection portions 31 of the second lead frames 33 and the board surface wirings 50M are electrically connected to each other through soldering or the like. This provides a configuration in which, when the circuit bodies are connected to each other, the wiring between the circuit bodies is integrated with the wirings between the circuit bodies and the printed circuit board 25 on the printed circuit board 25. Although not illustrated, a signal pad for the IGBT element 41 is electrically connected, through wire bonding or the like, to a signal wiring formed on the surface of the printed circuit board 25.

Although the present invention has been described regarding a structure where the conductor members 101 are mounted and connected to the surface-layer wirings on the circuit-bodies mounted side of the printed circuit board 25, the conductor members 101 may be additionally mounted and connected to the back-surface board layer 52 in order to enhance the effect.

Figure 11:
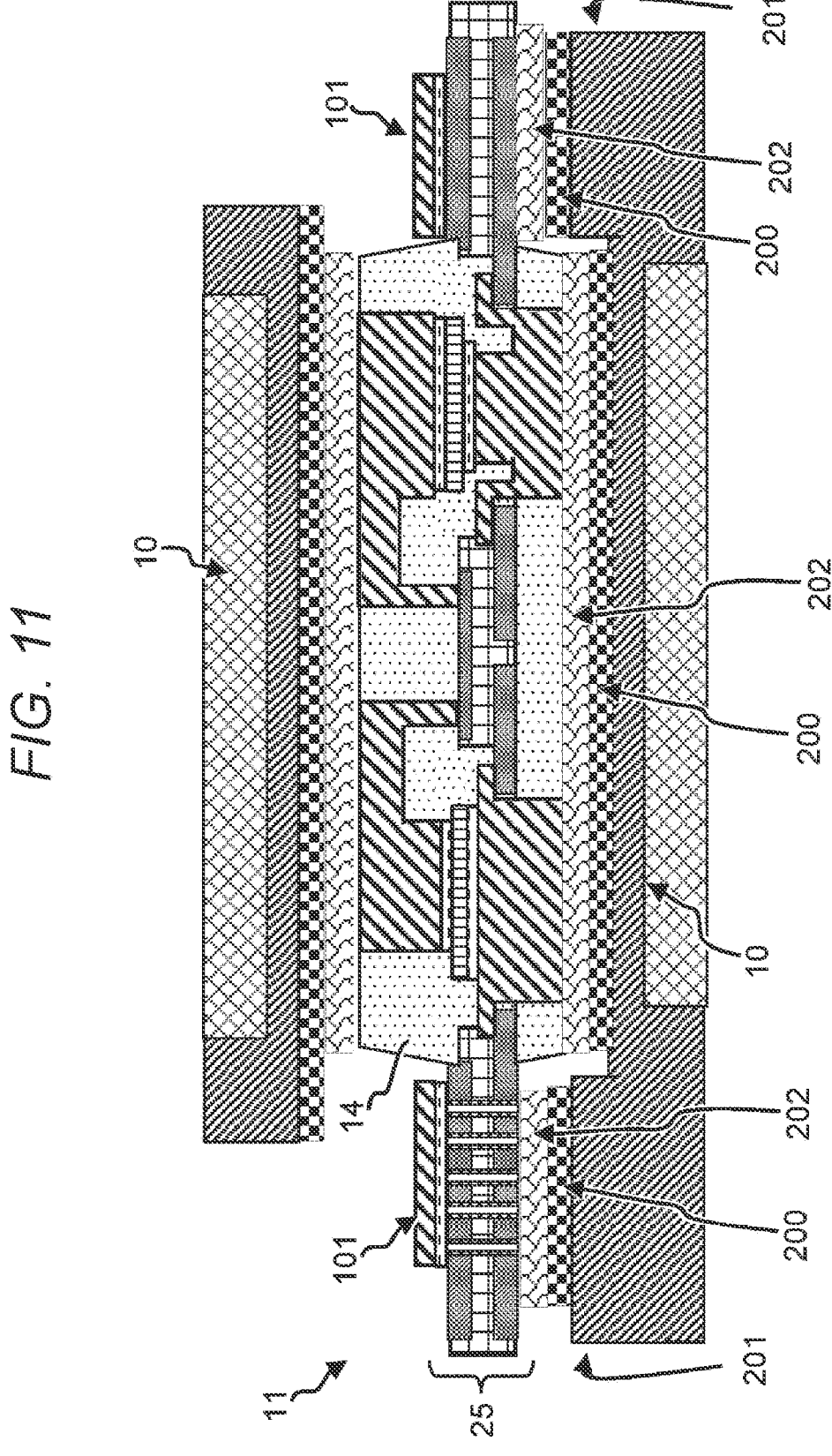
FIG. 11 is a view of circuit bodies when the lead packages and the printed-circuit-board main circuits in FIG. 10 have been connected to each other, and the cooling water paths have been provided therein.

FIG. 11 is a view of the circuit bodies when the lead packages and the printed-circuit-board main circuits in FIG. 10 have been connected to each other, and the cooling water paths have been provided therein.

The respective constituent components in the circuit bodies are fixed by the sealing resin 14, and the AC wiring and the DC wiring for the circuit bodies are in contact with heat dissipation protrusions 201 formed in the housing portion of the cooling water paths 10 with a thermal-conduction insulating sheet 200 interposed therebetween. This enables dissipating heat generated from the AC wiring and the DC wiring to the cooling water paths 10 through the heat dissipation protrusions 201.

Figure 12:
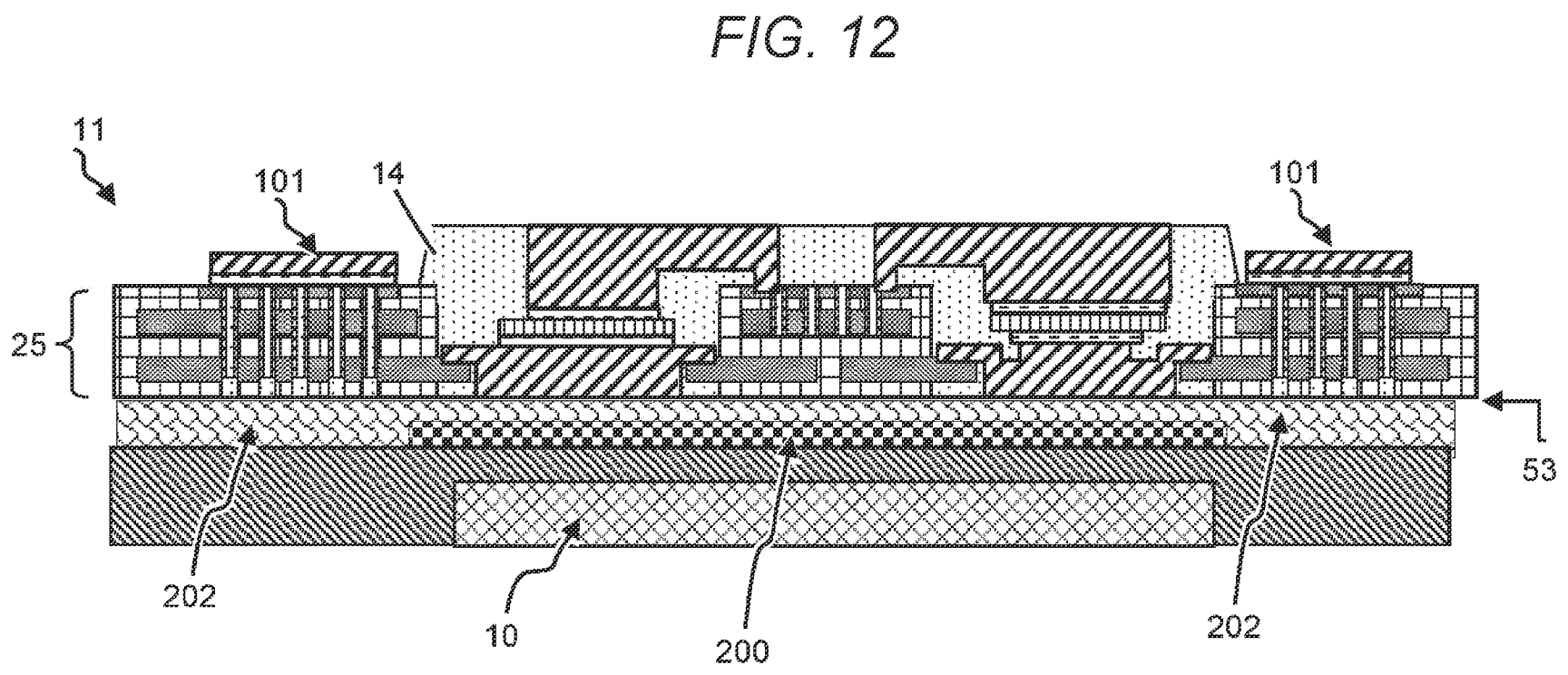

FIG. 12 is a modification of FIG. 11.

The back-surface board layer 52 (see FIG. 10) and the first lead frames 32 in the respective circuit bodies form a back-surface flat surface 53 on the back surface (the lower side in the paper surface) of the printed circuit board 25. The back-surface flat surface 53 is in contact with a cooling water path 10 with a heat dissipation adhesive member 202 interposed therebetween. This flat surface configuration makes it easier to connect the water path 10, the heat dissipation adhesive material 202, and the thermal-conduction insulating sheet 200 to each other, which can simplify the processes therefor.

Figure 13:
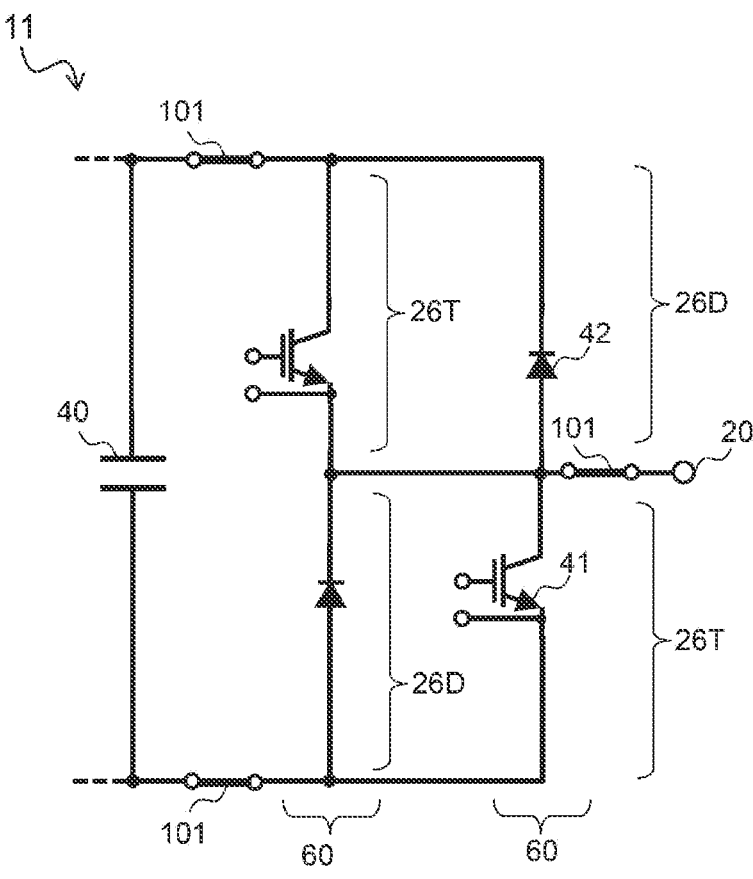
FIG. 13 is a circuit diagram after the lead packages and the printed circuit board are connected to each other.

FIG. 13 is a circuit diagram after the lead packages and the printed circuit board are connected to each other.

By connecting the lead packages 26 to the printed circuit board 25, there are formed upper-and-lower arm half circuits 60 each constituted by the IGBT 41 and the diode 42 in a pair of arms.

As described above, according to the present invention, it is possible to increase the driving current in the main circuit unit 11 included in the power conversion device. In addition, since the value of the current usable for driving can be increased without changing the size of the printed circuit board or the wiring thickness, it is possible to achieve cost reduction.

According to the aforementioned embodiment of the present invention, it is possible to provide the following effects and advantages.

(1) The power conversion device includes the plurality of circuit bodies each including a semiconductor element, and the printed circuit board 25 having the plurality of circuit bodies mounted thereon and having the relay wiring 28M connecting the plurality of circuit bodies to each other, the DC wiring 28D, and the AC wiring 28A, in which at least one of the AC wiring 28A and the DC wiring 28D is connected to the conductor member 101. This makes it possible to provide the power conversion device capable of achieving both cost reduction and high reliability.

(2) The AC wiring 28A and the DC wiring 28D are in contact with the cooling water paths 10 or the heat dissipation protrusions 201 formed in the cooling water paths 10 with the insulating sheet 200 interposed therebetween. This makes it possible to dissipate heat generated from the AC wiring 28A and the DC wiring 28D to the cooling water paths 10 through the heat dissipation protrusions 201.

(3) The AC wiring 28A, the relay wiring 28M, and the DC wiring 28D are each formed in such a way as to be exposed in the front surface and the back surface of the printed circuit board 25, and respective wirings in the front surface and respective wirings in the back surface are electrically connected to each other through the through vias 29. This makes it possible to integrate the wiring between the circuit bodies with the wirings between the circuit bodies and the printed circuit board 25, when the circuit bodies are connected to each other.

(4) The conductor member 101 is connected to the relay wiring 28M. This makes it possible to reduce the wiring resistance to increase the value of the current usable for driving, thereby reducing wiring heat generation.

(5) The plurality of circuit bodies are disposed in respective plurality of through holes 27 formed in the printed circuit board 25 and are mounted on the printed circuit board 25, the flat surface 53 is formed by the back surface of the printed circuit board 25 and surfaces of the plurality of circuit bodies at their sides penetrating the through holes 27, the flat surface 53 is in contact with a cooling water path 10 with the heat dissipation adhesive material 202 interposed therebetween. This makes it possible to facilitate the connection between the water path 10, the heat dissipation adhesive material 202, and the thermal-conduction insulating sheet 200, which can simplify the processes therefor.

(6) The conductor member 101 contains a carbon-based fiber material or an alloy material. This makes it possible to achieve reduction of wiring heat generation, due to the increased thermal conductivity of the conductor member 101.

Incidentally, the present invention is not limited to the aforementioned embodiment, and various modifications and other structures can be combined therewith without departing from the gist of the present invention. Further, the present invention is not limited to structures including all the structures described in the aforementioned embodiment, and also includes structures provided by eliminating some of these structures.

REFERENCE SIGNS LIST 1 inverter housing
2 lid body
3 AC connector
4 DC connector
5 signal connector
6 motor control board
7 gate drive board
8 smoothing capacitor
9 EMC filter
10 cooling water path
11 main circuit unit
12 board bonding pin
13 upper and lower arms
14 sealing resin
20 AC connection portion
21 DC connection portion
22 board bonding through hole
23 capacitor bonding through hole
24 fixing hole
25 printed circuit board
26 lead package
26T IGBT lead package
26D diode lead package
27 through hole
27a protruding portion
28A AC wiring
28M relay wiring
28D DC wiring
29 through via
30 first connection portion
31 second connection portion
32 first lead frame
33 second lead frame
34 pedestal electrode
40 snubber capacitor
41 IGBT element
42 diode element
50A AC wiring exposed portion
50M relay wiring exposed portion
50D DC wiring exposed portion
52 back-surface board layer
53 back-surface flat surface
59 lead exposed surface
60 upper-and-lower arm half circuit
70 conductor-member added portion
101 (carbon-based) conductor member
102 bonding member for (carbon-based) conductor member
200 thermal-conduction insulating sheet

8

201 heat dissipation protrusion
202 heat dissipation adhesive member

The invention claimed is:

1. A power conversion device, comprising:
a plurality of circuit bodies each including a semiconductor element; and
a printed circuit board having the plurality of circuit bodies mounted thereon and having a relay wiring connecting the plurality of circuit bodies to each other, a DC wiring, and an AC wiring,
wherein at least one of the AC wiring and the DC wiring is connected to a conductor member, and
wherein the AC wiring, the relay wiring, and the DC wiring are each formed in such a way as to be exposed in a front surface and a back surface of the printed circuit board, and respective wirings in the front surface and respective wirings in the back surface are electrically connected to each other through a through via.

2. The power conversion device of claim 1, wherein the AC wiring and the DC wiring are in contact with a cooling water path or a heat dissipation protrusion formed in the cooling water path with an insulating sheet interposed therebetween.

3. The power conversion device of claim 1, wherein the conductor member is connected to the relay wiring.

4. The power conversion device of claim 1, wherein the conductor member contains a carbon-based fiber material or an alloy material.

5. A power conversion device comprising:
a plurality of circuit bodies each including a semiconductor element; and
a printed circuit board having the plurality of circuit bodies mounted thereon and having a relay wiring connecting the plurality of circuit bodies to each other, a DC wiring, and an AC wiring,
wherein at least one of the AC wiring and the DC wiring is connected to a conductor member,
wherein the AC wiring, the relay wiring, and the DC wiring are each formed in such a way as to be exposed in a front surface and a back surface of the printed circuit board, and respective wirings in the front surface and respective wirings in the back surface are electrically connected to each other through a through via, and
wherein the plurality of circuit bodies are disposed in respective plurality of through holes formed in the printed circuit board and are mounted on the printed circuit board, a flat surface is formed by the back surface of the printed circuit board and surfaces of the plurality of circuit bodies at their sides penetrating the through holes, and the flat surface is in contact with a cooling water path with a heat dissipation adhesive material interposed therebetween.

* * * * *